United States Patent [19]

Miyashita et al.

[11] Patent Number: 5,325,573
[45] Date of Patent: Jul. 5, 1994

[54] METHOD OF FABRICATING A SAW DEVICE

[75] Inventors: Tsutomu Miyashita, Inagi; Yoshio Satoh, Atsugi, both of Japan

[73] Assignee: Fujitsu Limited, Kawasaki, Japan

[21] Appl. No.: 70,176

[22] Filed: Jun. 2, 1993

Related U.S. Application Data

[62] Division of Ser. No. 683,042, Apr. 10, 1991, Pat. No. 5,243,249.

[30] Foreign Application Priority Data

Apr. 11, 1990 [JP] Japan .................. 2-95532

[51] Int. Cl.$^5$ ............................ H01L 41/22
[52] U.S. Cl. ................. 29/25.35; 310/313 B; 333/195
[58] Field of Search ............. 29/25.35; 310/313 R, 310/313 B, 313 C, 313 D; 333/195

[56] References Cited

U.S. PATENT DOCUMENTS

| | | | |
|---|---|---|---|
| 4,203,082 | 5/1980 | Tsukamoto et al. | 333/194 |
| 4,223,284 | 9/1980 | Inoue et al. | 333/150 |
| 4,247,836 | 1/1981 | Redwood et al. | 333/195 |
| 4,492,940 | 1/1985 | Hikita | 333/194 |
| 4,649,357 | 3/1987 | Nagai et al. | 333/196 |
| 5,115,160 | 5/1992 | Knoll et al. | 310/313 B |

FOREIGN PATENT DOCUMENTS

| | | |
|---|---|---|
| 0176786 | 4/1986 | European Pat. Off. . |
| 57-015518 | 1/1982 | Japan . |
| 60-105310 | 6/1985 | Japan . |
| 1015488 | 4/1983 | U.S.S.R. . |

OTHER PUBLICATIONS

Patent Abstracts of Japan, vol. 7, No. 111 (E-175) May 14, 1983 & JP-A-58 031608 (Tokyo Shibaura Denki) Feb. 24, 1983.
Patent Abstracts of Japan, vol. 8, No. 88 (E-240) Apr. 21, 1984 & JP-A-59 008420 (Citizen) Jan. 17, 1984.

*Primary Examiner*—Carl E. Hall
*Attorney, Agent, or Firm*—Staas & Halsey

[57] ABSTRACT

A surface-acoustic-wave device comprises a substrate of a piezoelectric material for providing a passage of surface acoustic waves at an upper major surface of the substrate, a plurality of interdigital electrodes provided on the piezoelectric substrate in a row in correspondence to the passage of surface acoustic waves such that the electrodes are aligned in the propagating direction of the surface acoustic waves, each of the plurality of interdigital electrodes having a first part connected to a bonding pad on the substrate for external electric connection and having a plurality of finger electrodes extending parallel with each other in a direction crossing the propagating surface acoustic waves, and a second part separated from the first part and having a plurality of finger electrodes extending parallel with each other in a direction opposite to the direction of the finger electrodes of the first part. An interconnection pattern is provided on the surface of the substrate in correspondence to a region offset from the passage of the surface acoustic waves for connecting the second parts of adjacent interdigital electrodes with each other.

5 Claims, 7 Drawing Sheets

METHOD OF FABRICATING A SAW DEVICE

This application is a division of application Ser. No. 07/683,042, filed Apr. 10, 1991, now U.S. Pat. No 5,243,249.

BACKGROUND OF THE INVENTION

The present invention generally relates to a so-called surface-acoustic-wave device having a plurality of interdigital electrodes, and in particular to the structure and fabrication process for eliminating the occurrence of sparking discharges between the fingers of the electrodes during the process of device fabrication.

Recently, the demand for increased operational speed of information processing apparatuses and communication apparatuses has caused the shift of the frequency of for the carriers or signals to higher frequency regions. In correspondence to such a shift of the frequency, filters capable of operating in such high frequency regions are required. For this purpose, the surface-acoustic-wave (abbreviated hereinafter as SAW) devices are used.

In view of the expected developments in the future, Particularly in the field of automobile telephones and portable telephones, efforts are being made to develop SAW devices having a sharp attenuation in the frequency region outside the pass-band while maintain a uniform band-pass characteristic. By using the SAW devices in place of the conventional dielectric filters, the size of the filters can be reduced to about 1/30th of the size of conventional filters and the size of the telephone can be reduced accordingly.

A typical SAW device, such as the SAW filter, uses a piezoelectric substrate having large electromechanical coupling coefficients and small temperature coefficient of frequency. For example, a single crystal of $LiTaO_3$ is used widely. The crystal of $LiTaO_3$ is cut in a predetermined orientation, and interdigital electrodes are provided on the substrate as the input and output electrodes.

FIG. 1 shows the geometrical parameters characterizing a typical interdigital electrode.

Referring to FIG. 1, the electrode comprises a first part EL1 and a second part EL2 each respectively having a number of fingers $f_1$-$f_n$ and $g_1$-$g_n$, wherein each finger has a width W and is separated from adjacent fingers by a separation S. Designating the wavelength of the surface acoustic wave as $\lambda$, the width W and the separation S are generally set to satisfy the relation $W=S=\lambda/4$. Thereby, the pitch defined in FIG. 1 as P is set to $P=\lambda/2$. Further, each finger in the electrode EL1 and each finger in the electrode EL2 are provided to form a uniform overlap as shown in FIG. 1. Such an electrode is called the uniform overlap electrode.

When forming a SAW filter having a central band pass frequency of 835 MHz, for example, the pitch P is set to 2.45 $\mu m$ while the width W and the separation S are set to 1.23 $\mu m$ in correspondence to the velocity of 4090 m/sec of the surface acoustic wave in the X-direction. It should be noted that the foregoing velocity provides the wavelength $\lambda$ of 4.9 $\mu m$ for the surface acoustic wave of 835 MHz. Generally, a pair of such electrodes EL1 and EL2 are provided. In the Particular applications of SAW devices such as automobile telephones or portable telephones, on the other hand, devices having a small insertion loss, a wide Pass-band and a large suppression for the frequency components outside the pass band, are required. For example, an insertion loss of 3–5 dB or less, a pass band of 25 MHz or more a side lobe suppression of 24–25 dB or more may be required for the SAW filter having the central frequency of 835 MHz.

In order to satisfy these various requirements, the applicants of the present invention have proposed devices and previously disclosed in the United States, European, Korean and Canadian patent applications entitled "SURFACE-ACOUSTIC-WAVE FILTER HAVING A PLURALITY OF ELECTRODES," based upon the Japanese patent applications 2-69121 and 2-86236, and which are incorporated herein by reference.

FIG. 2 shows a wafer 1 on which a number of SAW devices 2 are formed. Typically, the SAW devices 2 are arranged in the rows and columns with dicing lines 3 formed between adjacent SAW devices 2. When the formation of the SAW devices 2 is completed, the wafer 1 is subjected to a dicing Process wherein the wafer 1 is cut by a diamond saw along the dicing lines 3. Thereby, the SAW devices 2 are separated from each other.

FIG. 3 shows a typical conventional example of the SAW device 2 before the dicing process is carried out.

Referring to FIG. 3, the device 2 is surrounded by the dicing line 3, and a number of input electrodes 21 and a number of output electrodes 22 are formed alternately on the surface of the substrate 1 to form a row of electrodes. Each of the input electrodes 21 comprises a first part, corresponding to the part EL1 of FIG. 1, connected to a common input bonding pad 28 and a second part, corresponding to the part EL2 of FIG. 1, connected to a ground pad 27. The ground pad 27 is provided in correspondence to each interdigital electrode 21. Similarly, each output electrode 22 comprises a first part connected to a common output bonding pad 28' and a second part connected a ground pad 27'. Further, a pair of reflectors 25 of the open strip type are formed at both sides of the row of electrodes 21 and 22. The dicing line 3 is merely a hypothetical line for dicing the wafer into the individual devices.

Meanwhile, during the fabrication of the conventional SAW devices, there arises a problem in that, associated with various heating processes employed during the fabrication, the surface of the Piezoelectric substrate is charged due to the pyroelectricity. It should be noted that, in the structure of FIG. 3, the input electrodes 21 and the output electrodes 22 are isolated from each other. Further, in each input and output electrodes, the second part connected to the ground pad 27 or 27' is isolated from each other. In such a structure, the electric charges induced by the pyroelectric effect are accumulated and such accumulation of electric charges induces a sparking discharge between adjacent fingers of the interdigital electrodes. As the separation between the fingers is in the order of several microns in correspondence to the wavelength of the surface acoustic waves, a small amount of such electric charges is sufficient to cause such sparking.

FIG. 4 shows an electrode wherein such sparking has occurred. It should be noted that such sparking discharge damages the finger of the interdigital electrodes and hence the SAW device. In FIG. 4, the fingers $50a$ and $50b$ represent the fingers that have experienced the sparking discharge. Thereby, the yield of the device is inevitably deteriorated.

SUMMARY OF THE INVENTION

Accordingly, it is a general object of the present invention to provide a novel and useful SAW device and a fabrication process thereof, wherein the foregoing problems are eliminated.

Another and more specific object of the present invention is to provide a SAW device and a fabrication process thereof, wherein the sparking discharge between the fingers of the electrode is eliminated.

Another object of the present invention is to provide a SAW device and a fabrication process thereof, wherein the sparking discharge between the fingers of the electrode is eliminated while not degrading the operational characteristics of the device.

Another object of the present invention is to provide a SAW device and a fabrication process thereof, wherein a plurality of interdigital electrodes are formed on a piezoelectric substrate, and the interdigital electrodes are formed such that each finger of each interdigital electrode is connected with each other commonly, prior to the dicing process. According to the present invention, the problem of sparking discharge between the finger electrodes during the fabrication process, due to the pyroelectricity, is positively eliminated by neutralizing the electric potential induced in various conductor parts of the device.

Another object of the present invention is to provide a SAW device and a fabrication process thereof, wherein a plurality of interdigital electrodes are formed on a piezoelectric substrate, the interdigital electrodes being formed such that each finger of each interdigital electrode is connected commonly with each other by an interconnection pattern prior to the dicing process, in which the interconnection pattern is formed to avoid the path of the surface acoustic waves in the device. According to the present invention, undesirable deterioration of the device characteristics by the interconnection pattern disturbing the passage of the surface acoustic waves is avoided.

Other objects and further features of the present invention will become apparent from the following detailed description when read in conjunction with the attached drawings.

DETAILED DESCRIPTION

Figure 5:
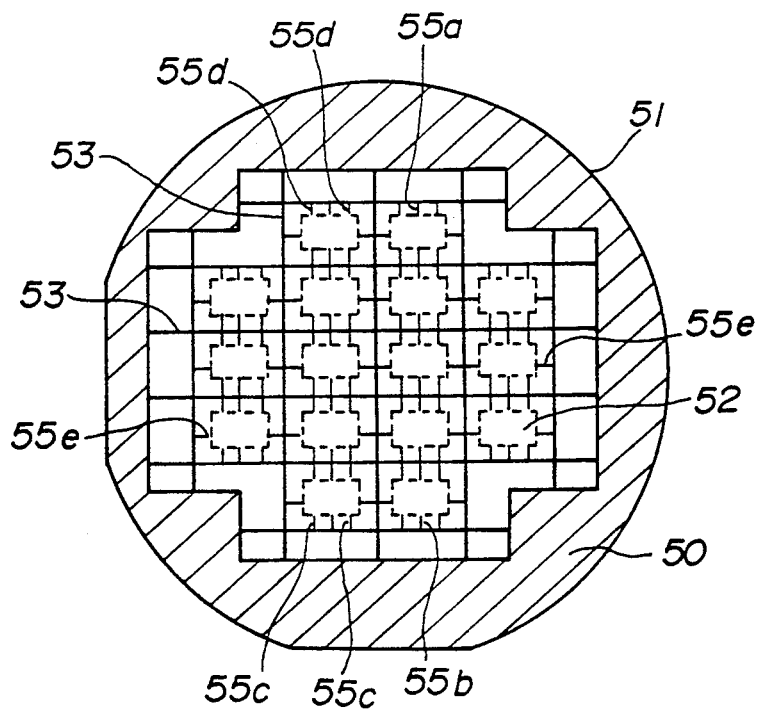
FIG. 5 is a diagram showing the wafer carrying the SAW devices according to a first embodiment of the present invention.

FIG. 5 shows a wafer 51 on which a number of SAW devices 52 according to a first embodiment of the present invention are formed. The wafer 51 comprises a piezoelectric single crystal such as 36°Y-X $LiTaO_3$ and may have a diameter of 51 cm and a thickness of 0.5 mm. The SAW devices 52 are bounded by a number of scribe lines 53 formed of a conductor material that may be identical with the material forming the electrodes of the SAW devices. The surface of the substrate 51 is covered by a conductor film 50 except for those regions on which the SAW devices 52 are formed, and the scribe lines 53 are connected to the conductor film 50. Further, the electrode of each SAW device 52 is connected to the conductor film 50 via a number of conductor strips 55a–55e. It should be noted that FIG. 5 shows the wafer before the dicing is deformed.

Figure 3:
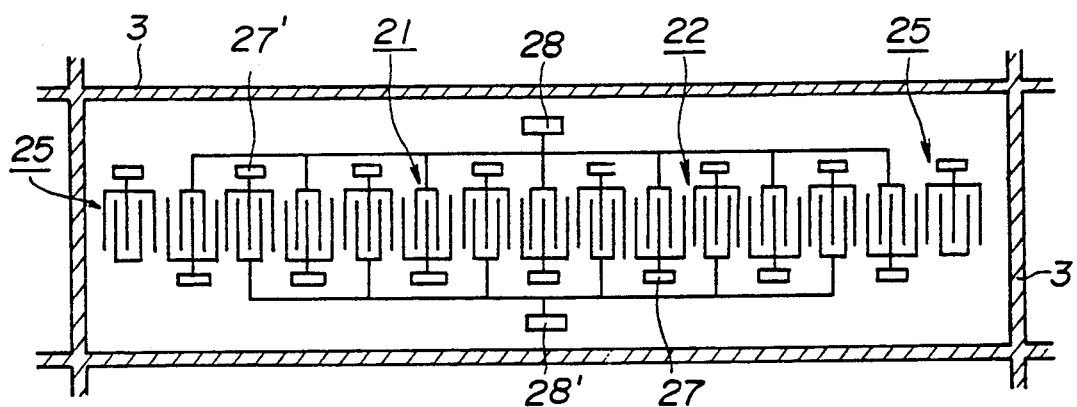
FIG. 3 is a diagram showing the construction of a SAW device formed on the wafer of FIG. 2.
Figure 4:
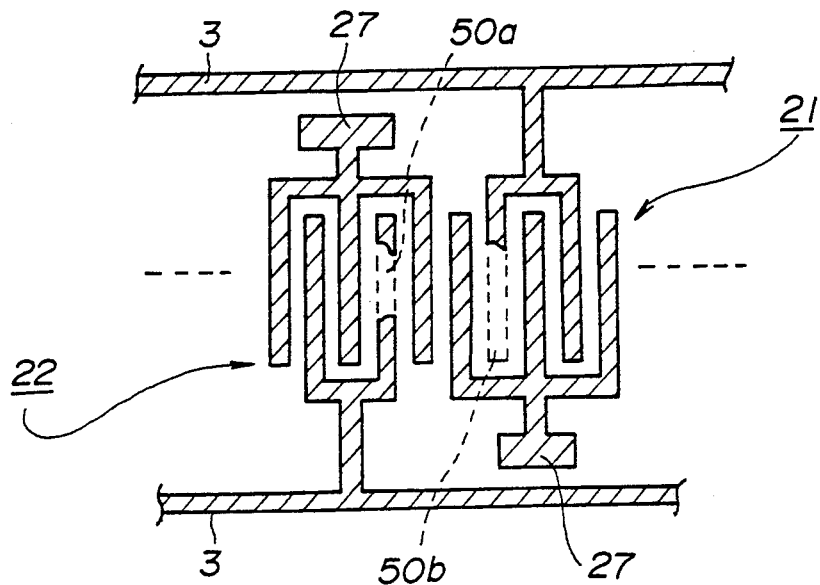
FIG. 4 is a diagram showing a example in which sparking discharge occurred in the SAW device of FIG. 3 during the fabrication process thereof.
Figure 6:
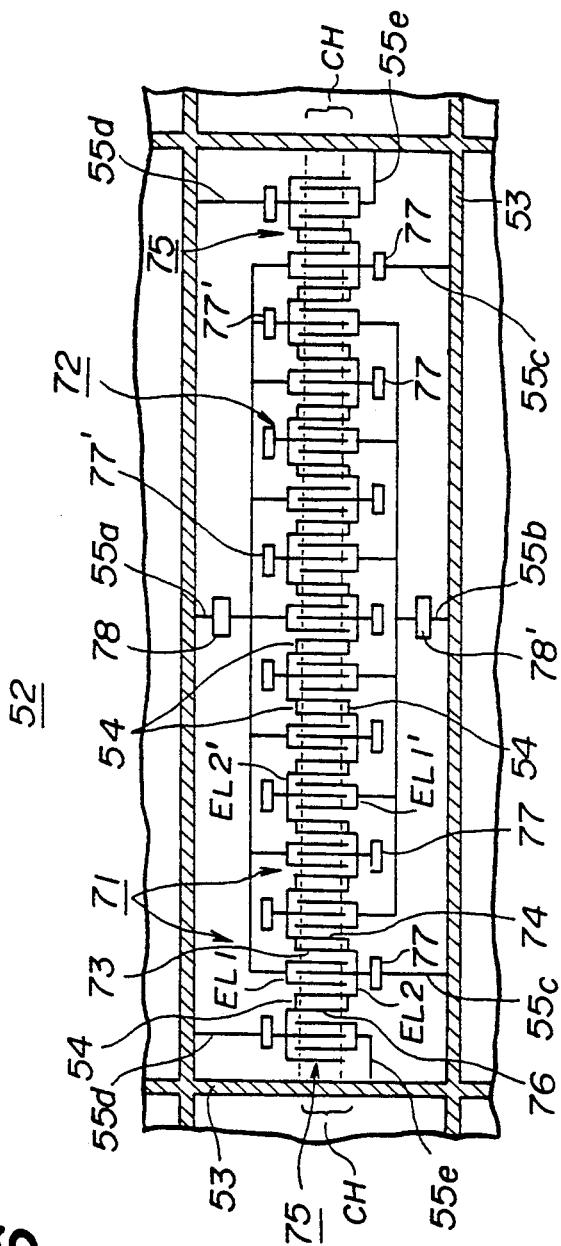
FIG. 6 is a diagram showing the details of the SAW device of the first embodiment of the present invention.

FIG. 6 shows the construction of the SAW device according to the first embodiment. Referring to FIG. 6, the SAW device 52 has a construction substantially identical with the SAW device of FIG. 3 in that a number of input interdigital electrodes 71 corresponding to the input interdigital electrodes 21 and a number of output interdigital electrodes 72 corresponding to the output interdigital electrodes 22 are formed on the upper major surface of the piezoelectric wafer 51.

Figure 1:
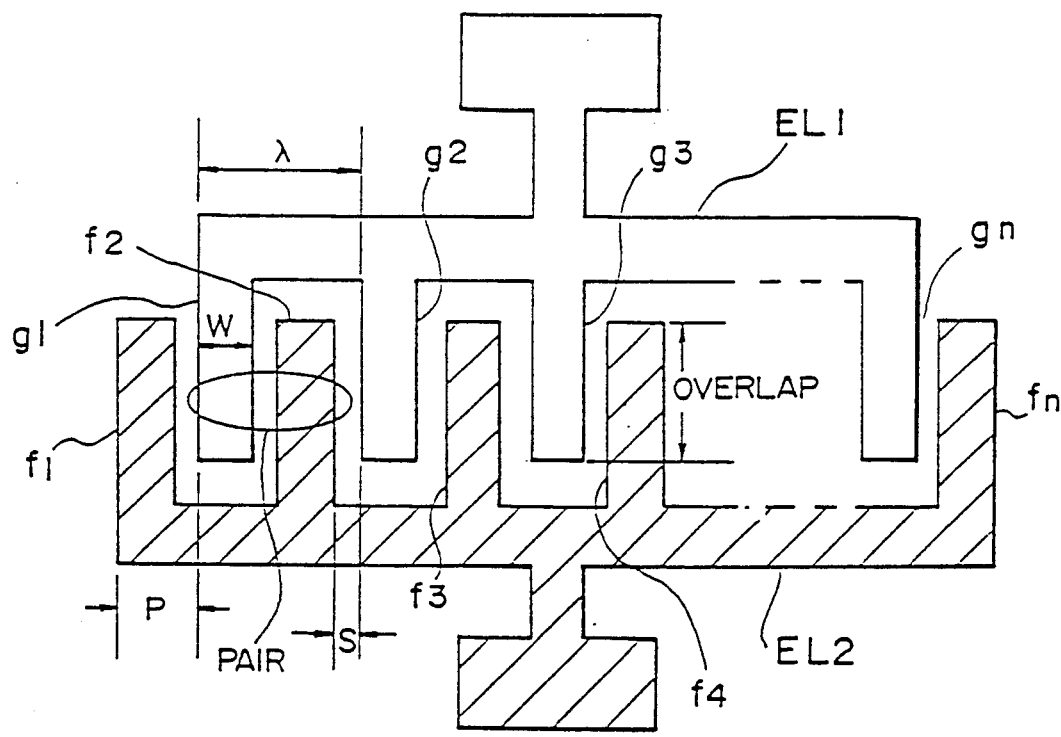
FIG. 1 a diagram showing a typical interdigital electrode.
Figure 2:
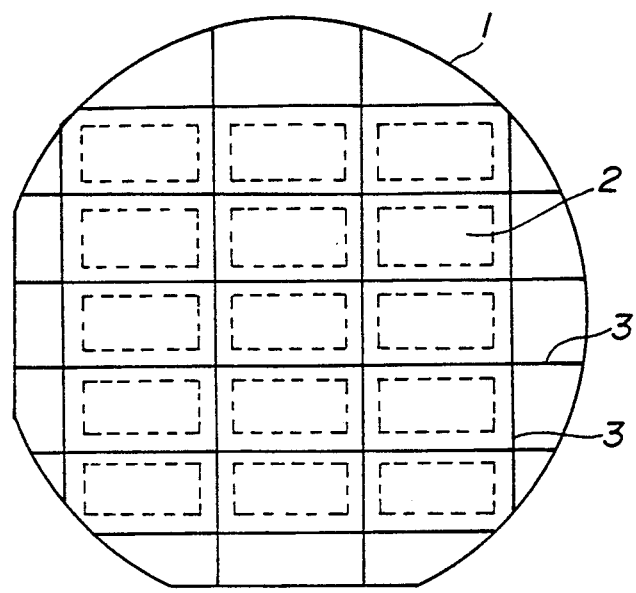
FIG. 2 is a diagram showing a wafer on which a number of SAW devices is formed.

The SAW device is bounded by the scribe line, 53 as shown, and each interdigital electrode 71, comprising a first part EL1 corresponding to the first part EL1 of FIG. 1 and a second part EL2 corresponding to the second part EL2 of FIG. 1. The plurality of individual finger electrodes of the first part EL1 are arranged in plural first groups (i.e., two finger electrodes per group) and are connected commonly to an input bonding pad 78 on the upper major surface of the wafer 51 and the plurality of individual finger electrodes of the second part EL2 are arranged in plural second groups (i.e., three fingers per group) and each second group is connected to a respective ground pad 77 provided on the upper major surface of the wafer 51 in correspondence to the associated input interdigital electrode 71. Further, each interdigital output electrode 72 comprises a first part EL1' corresponding to the part EL1 of FIG. 1 and a second part EL2' corresponding to the part EL2 of FIG. 1. The plurality of finger electrodes of the first part EL1' likewise are arranged in plural first groups and are connected commonly to an output bonding pad 78' on the upper major surface of the wafer 51 and the plurality of finger electrodes of the second part EL2' likewise are arranged in plural second groups and each second group is connected to a respective ground pad 77' provided also on the upper major surface of the wafer 51 in correspondence to the associated electrode 72. As seen in FIG. 6, and with respect to each of the input digital electrode 71 (and also as to the output digital electrode 72), each first group of plural finger electrodes of the first part EL1 (and likewise as to each first group of the first part EL1' of the output digital electrode 72) has respectively associated therewith a second group of plural finger electrodes of the second part EL2 of the input digital electrode 71 (and likewise as to the second group of finger electrodes of the second part EL2' of the output digital electrode 72). Further, these sets of respectively associated first and second groups of finger electrodes, respectively electrodes 71 and 72, are provided alternately on the upper major surface of the wafer 51 to form a row extending in the propagation direction of the surface acoustic wave. Thereby, a passage or channel CH of the surface acoustic wave is defined in each SAW device extending in the X-direction (i.e., in the orientation of FIG. 6) and within a region (extending in the transverse, or Y-direction) wherein the fingers of the first part EL1 or EL1' are in an overlapping relationship (i.e., are interdigitized) with the fingers of the second part EL2 or EL2' when viewed in and thus relatively to the propagating direction of the surface acoustic wave. The respective individual finger electrodes of each set of associated first and second groups are arranged in interdigitized, alternating and spaced relationship. Further, the finger electrodes of the first group, of the first part EL1 of the input electrodes 71, extend in a first direction (downwardly, as seen in FIG. 6) transverse to the X-direction of the channel CH, and the individual finger electrodes of the second group extend in a second direction (upwardly, as seen in FIG. 6) likewise transverse to the X-direction of the channel CH. The individual finger electrodes of the first and second groups of the output electrode 72 are similarly arranged in alternating and interdigitized, spaced relationship but extend in the opposite directions to those of the respective, first and second groups of the input electrode 71; thus, the finger electrodes of the first group extend in the second direction and the finger electrodes of the second group extend in the first direction, both being transverse to the X-direction of the channel CH. Further, at the opposite sides of the row of electrodes 71 and 72, a pair of respective reflectors 75 are provided, likewise in correspondence to the channel CH.

In the structure of FIG. 6, the input bonding pad 78 is electrically connected to the conductor scribe line 53 by the conductor strip 55a. Similarly, the output bonding pad 78' is connected electrically to the scribe line 53 by the conductor strip 55b. Further, the second part EL2 and the second part EL2' of the electrodes 71 and 72 are connected with each other by a pair of interconnection strips 54, and these second parts EL2 and EL2' are connected to the scribe line 53 via the conductor strip 55c at the two electrodes 71 located at the outer ends of the electrode row. Further, each reflector 75 is connected to the part EL2 of the adjacent electrodes 71 via the interconnection strip 54 and further to the dicing line 53 via the interconnection strip 55e.

As already noted, the scribe lines 53 are formed from a conductor strip and connected to the conductor layer 50 covering the surface of the wafer 51. The conductor layer 50, the scribe lines 53, the interconnections 54 and 55a–55e, the electrodes 71 and 72, the reflectors 75, and the bonding pads 78 and 78', are all formed from aluminum-copper alloy sputtered on the wafer 51 with a thickness of 200 nm and patterned subsequently by the photolithographic process.

When the SAW device is designed to have the central frequency of 836 MHz, the pitch P is set to 2.4 μm while the width W and the separation S are set to 1.2 μm, as described previously. In the illustrated example, the number of input electrodes 71 is seven while the number of output electrodes 72 is six. In each input electrode 71, there are 19 pairs of opposing electrode fingers with a uniform overlap throughout the electrodes 71. In each output electrode 72, on the other hand, there are 30 pairs of opposing electrode fingers, with a uniform overlap throughout the electrodes 72. In the reflector 75, there are thirty pairs of fingers. It should be noted that the reflectors 75 have the open-strip construction wherein the first part EL1 and the second part EL2 are isolated from each other. The concept of an electrode finger pair and the concept of overlap are defined in FIG. 1. The channel CH is defined as the region of overlap of the electrode fingers.

Figure 7:
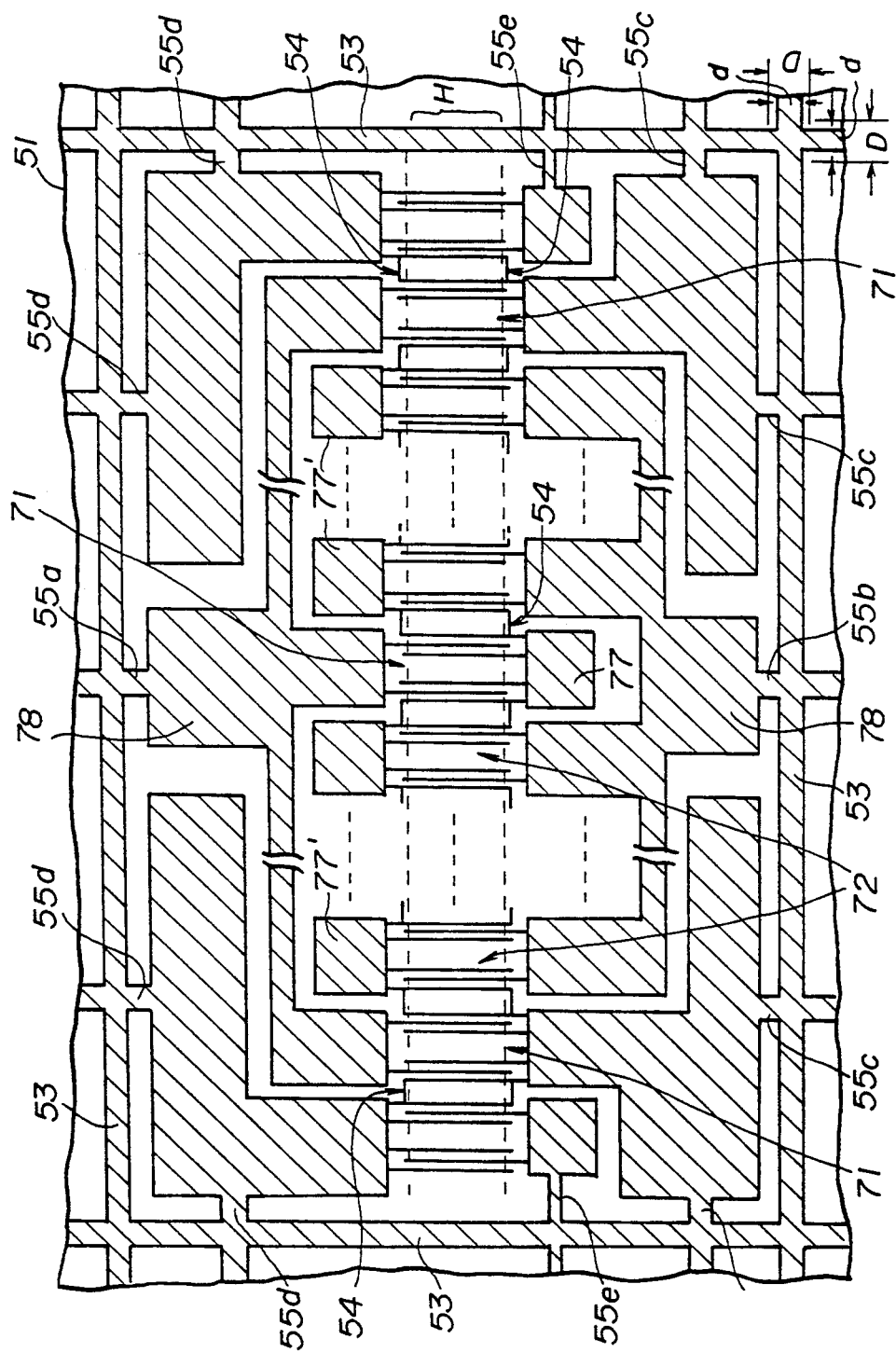
FIG. 7 is a diagram showing a SAW device according to a second embodiment of the present invention.
Figure 8:
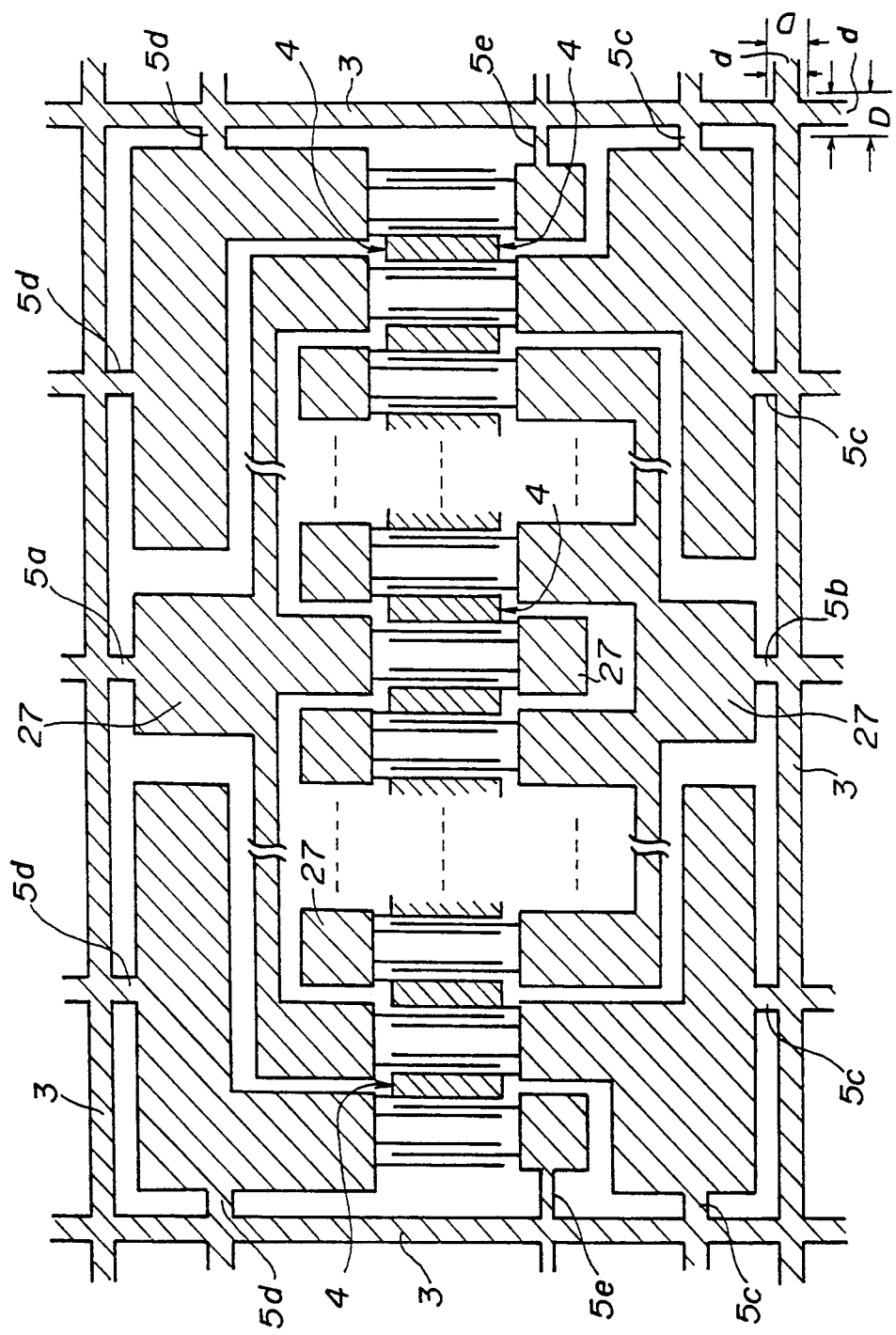
FIG. 8 is a diagram showing a SAW device presented as a reference for showing the effect of the present invention.

Here, it should be noted that the interconnection strips 54 connecting the second parts EL2 and EL2' of adjacent electrodes 71 and 72 are provided outside the channel region CH to avoid presenting any disturbance to the propagating surface acoustic waves. In FIG. 6, the channel region CH is shown to be included in the region defined between the opposing interconnections 54 to avoid the overlapping of lines in the drawing. However, it should be noted that the upper and lower boundaries of the region CH may coincide with the interconnection strips 54 as long as the propagation of the surface acoustic wave is not disturbed. The effect of the interconnection strips 54 being provided within the region CH as shown in FIG. 8 will be presented later in a comparison with the SAW device of the present invention as shown in FIGS. 6 and 7. It should be noted that a single interconnection strip 54 may be used for connecting the part EL2 and the part EL2', instead of using two such strips 54 as illustrated in FIG. 6. The interconnections 55a–55e are also provided such that the propagation of the surface acoustic waves is not disturbed.

By forming the devices 52 as shown in FIGS. 5 and 6 before the dicing process, any positive and negative electric charges that are induced on the surface of the piezoelectric wafer 51, by the pyroelectricity, are neutralized with each other by flowing through the scribe lines 53, the interconnections 54 and the interconnections 55a–55e.

After the SAW devices 52 are formed, the SAW devices 52 are separated from each other by dicing along the dicing lines 53 by a diamond saw fixture. Thereby, the devices 52 are mechanically as well as electrically separated from each other.

FIG. 7 shows a second embodiment of the SAW device of the present invention. This embodiment shows the construction of the SAW device of a more practical form. It should be noted, however, that the essential feature of the device of FIG. 7 is substantially identical with the device of FIG. 6. Thus, those parts corresponding to the parts described previously with reference to FIG. 6 are designated by the same reference numerals and the description thereof as to FIG. 7 will be omitted.

As shown in FIG. 7, the scribe line 53 is formed with a width d that is typically about 50 μm. After the completion of formation of the SAW device on the wafer 51, the devices are separated from each other by performing the dicing process along the dicing line 53. This dicing process is achieved by using a diamond saw that removes the material of the wafer 51 over a width D that is larger than the width d. Typically, the width D has a value of 80–100 μm. Thereby, the interconnections 55a–55e are separated completely from the ground and hence from the various parts, including the finger electrodes of the input and output electrodes 71 and 72, that are connected to the interconnections 55a–55e. With this process, the SAW device becomes operational. As the finger electrodes are connected to the ground via the dicing line 53 and the interconnection strips 55a–55e during the process of forming the SAW devices 52 on the wafer 51, the problem of accumulation of electric charges and associated sparking discharge during the heating process employed in the fabrication of the device is successfully avoided.

According to the present invention, production of the defective devices due to the sparking discharge between the electrodes is eliminated almost completely. It should be noted that, in the conventional process, 50–80% of the devices usually had some form of defects due to the sparking discharge.

Figure 9:
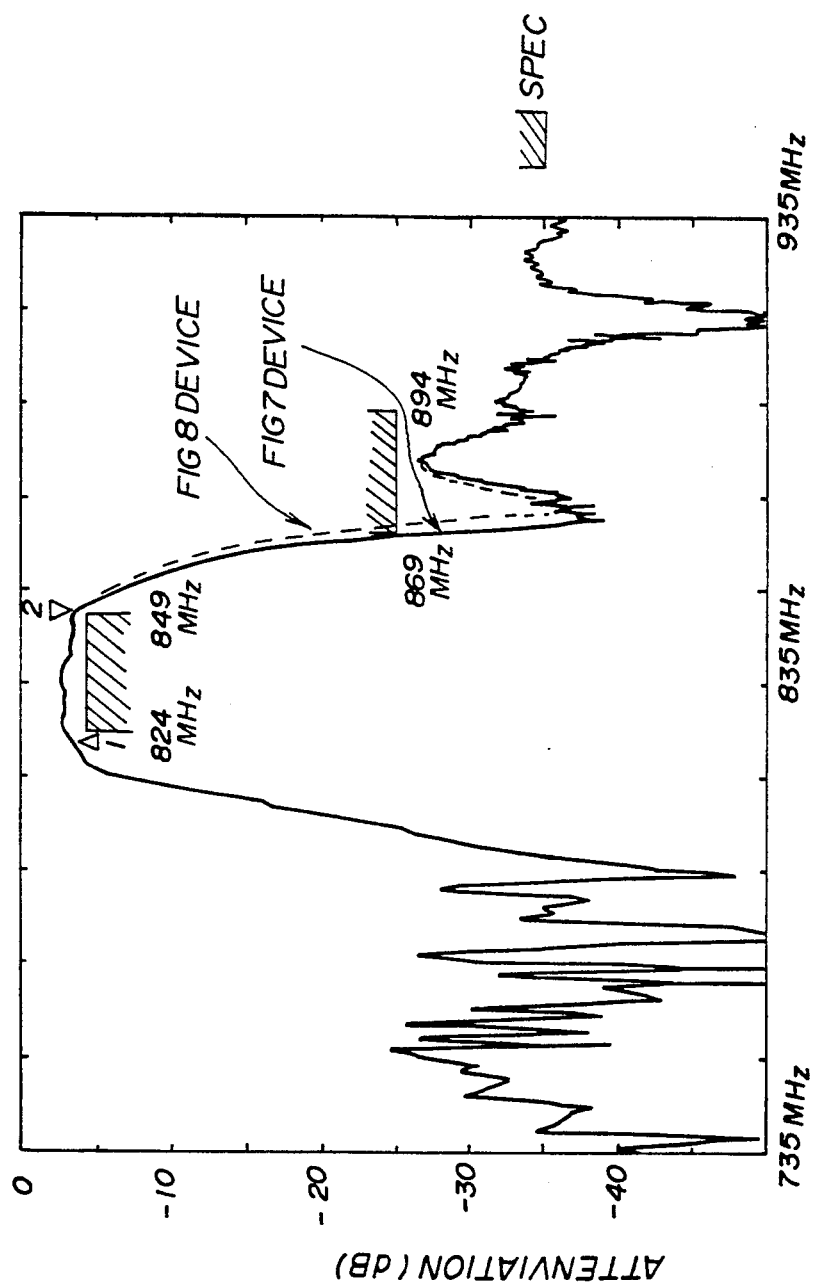
FIG. 9 is a diagram showing the frequency characteristic the SAW device of FIG. 7 in comparison with the characteristics of the device of FIG. 8.

FIG. 9 shows the frequency characteristics of the SAW device of FIG. 7. This device has the central frequency thereof set to 835 MHz and is designed to have a pass-band between 822.5 MHz and 850.5 MHz. Further, the device is designed to satisfy a specification requiring a side lobe rejection of −25 dB or more in the frequency range between 869 MHz and 894 MHz. In FIG. 9, there is another characteristic curve shown by a broken line. This characteristic curve is for the device of FIG. 8 that is substantially identical with the device of FIG. 7 except that the region 4 between each opposing pair of interconnection strips 54 (i.e., of FIGS. 6 and 7) is filled by aluminum. In other words, the device of FIG. 8 has an interconnection structure which is arranged to intersect the propagating path CH of the surface acoustic wave. As can be seen in FIG. 9, the degree of side lobe rejection at 869 MHz is smaller by more than 5 dB than the device of FIG. 7. Thus, the SAW device of the present invention, having the interconnection strips 54 provided so as to avoid the channel region of the surface acoustic wave, is not only capable of eliminating the sparking discharge at the time of fabrication but also provides an excellent frequency characteristic.

Figure 10:
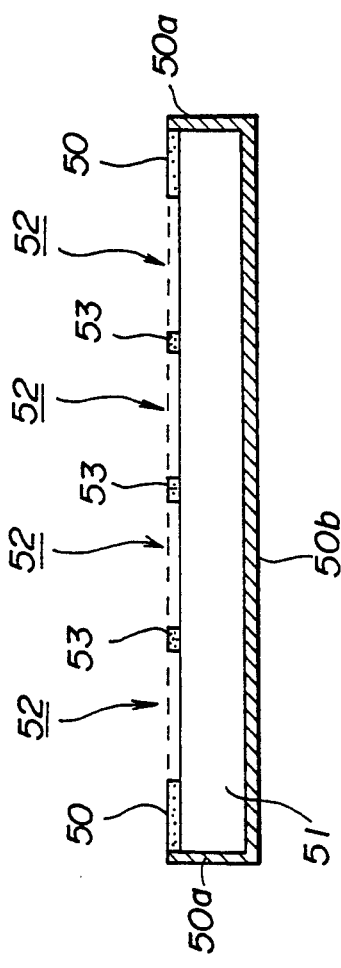
FIG. 10 is a diagram showing a third embodiment of the present invention.

FIG. 10 shows a third embodiment of the present invention, wherein only the cross section is shown. It should be noted that the SAW device of the present embodiment of FIG. 10 has a construction identical with the device of FIG. 6 or FIG. 7 in the plan view.

Referring to FIG. 10, the side wall and the lower major surface of the wafer 51 are completely covered by conductor layers 50a and 50b. Such conductor layers may be formed by depositing a titanium film having a thickness of about 50 nm and then an aluminum film having a thickness of about 300 nm by the vacuum deposition process such that the layers 50a and 50b make an electric connection to the conductor layer 50 on the upper major surface of the wafer 51.

By covering the side wall and the lower major surface of the wafer 51 in this way, the electric potential at the surface of the wafer 51 becomes identical throughout the entire surface and the problem of sparking discharge of the finger electrodes due to the pyroelectricity is completely eliminated. After the structure of FIG. 10 is formed, the SAW devices 52 are formed by a series of photolithographic patterning processes that are well established in the art.

Further, the present invention is not limited to the embodiments described heretofore, but various variations and modifications may be made without departing from the scope of the invention. corresponding to a surface-acoustic-wave device said first conductor strip being connected with each device pattern electrically, each of said device patterns including a plurality of interdigital electrodes provided on the upper major surface of the substrate so as to form a row in correspondence to a passage of surface acoustic waves such that the electrodes are aligned, as a row, in the propagating direction of the surface acoustic waves, each of said plurality of interdigital electrodes comprising a first part connected to a bonding pad provided on the upper major surface of the substrate for external electric connection and having a plurality of finger electrodes extending parallel with each other in a direction that is included in the upper major surface of the substrate and crossing the passage of the surface acoustic waves, and a second part separated from the first part and having a plurality of finger electrodes extending parallel with each other in a direction opposite to the direction of the finger electrodes of the first part, said first part and said second part being so disposed, in each interdigital electrode, that said finger electrodes of the first part and said finger electrodes of the second part are repeated alternately in the propagating direction of the surface acoustic waves with an overlapping of the opposing finger electrodes when viewed in the propagating direction of the surface acoustic waves, said opposing finger electrodes defining the passage of the surface acoustic waves, a second conductor strip provided on the upper major surface of the substrate in correspondence to a region offset from the passage of the surface acoustic waves for connecting the second parts of adjacent interdigital electrodes with each other, a third conductor strip provided on the upper major surface of the substrate in correspondence to a region offset from the passage of the surface acoustic waves for connecting the bonding pad to the first con

What is claimed is:
1. A method for fabricating a surface-acoustic-wave device, comprising the steps:
   covering an upper major surface of a piezoelectric substrate with a conductor layer;
   patterning the conductor layer to form a plurality of device patterns that are separated from each other by a first conductor strip, said first conductor strip being formed so as to extend along a dicing line defined on the upper major surface of the substrate for separating the substrate into a number of chips each ductor strip electrically, and a fourth conductor strip provided on the upper major surface of the substrate in correspondence to a region offset from the passage of the surface acoustic waves for connecting the second part of the interdigital electrodes to the first conductor strip and; and
   separating the surface-acoustic-wave devices from each other by dicing along the dicing line that the first conductor strip is removed from each surface-acoustic-wave device.

2. A method as claimed in claim 1 in which said step of separating the surface-acoustic-wave devices comprises a sawing process wherein the substrate is cut along the dicing line by a saw with a width substantially larger than a width of the first conductor strip.

3. A method as claimed in claim 1 in which each of said plurality of device patterns further comprises a pair of reflector patterns provided at both ends of the row of electrodes for reflecting the surface acoustic waves, wherein each of said reflector patterns is connected to the first conductor strip.

4. A method as claimed in claim 2 in which said step of patterning the conductor layer is performed such that the conductor layer is left on the upper major surface of the substrate and surrounds the plurality of device patterns, said patterning being made such that the first conductor strip is connected to the conductor layer left on the upper major surface of the substrate.

5. A method as claimed in claim 4 in which said step of covering the upper major surface of the substrate is carried out such that a side wall and a lower major surface of the substrate opposing the upper major surface of the substrate are covered by a conductor layer such that the conductor layer covering the side wall and such that the lower major surface of the substrate is connected electrically to the conductor layer left on the upper major surface of the substrate, and said step of patterning is performed such that the conductor layer covering the side wall and the lower major surface of the substrate is left unpatterned.

* * * * *

UNITED STATES PATENT AND TRADEMARK OFFICE
CERTIFICATE OF CORRECTION

PATENT NO. : 5,325,573
DATED : July 5, 1994
INVENTOR(S) : MIYASHITA et al.

It is certified that error appears in the above-indentified patent and that said Letters Patent is hereby corrected as shown below:

Title Page: [75] Inventors: change "Atsugi" to --Kanagawa--.

Col. 1, line 25, change "Particularly" to --particularly--;
line 28, change "maintain" to --maintaining--;
line 51, change "$\lambda$" to --$\underline{\lambda}$--;
line 52, change "$\lambda$" to --$\underline{\lambda}$--;
line 65, change "Particular" to --particular--;
line 68, change "Pass-band" to --pass-band--.

Col. 2, line 4, after "more" (first occurrence) insert --and--;
line 9, change "and" to --as--;
line 47, change "Piezoelectric" to --piezoelectric--.

Col. 3, line 47, after "FIG. 1" insert --is--.

Col. 4, line 20, change "deformed" to --performed--;
line 30, delete ",".

Col. 7, lines 61-68, delete "corresponding to a ... row, in the propa-".

Col. 8, lines 1-29, delete "gating direction of the surface ... pad to the first con".

UNITED STATES PATENT AND TRADEMARK OFFICE
CERTIFICATE OF CORRECTION

PATENT NO. : 5,325,573
DATED : July 5, 1994
INVENTOR(S) : MIYASHITA et al.

It is certified that error appears in the above-indentified patent and that said Letters Patent is hereby corrected as shown below:

Col. 8, line 41, after "each" delete "ductor" and insert --corresponding to a surface-acoustic-wave device, said first conductor strip being connected with each device pattern electrically, each of said device patterns including a plurality of interdigital electrodes provided on the upper major surface of the substrate so as to form a row in correspondence to a passage of surface acoustic waves such that the electrodes are aligned, as a row, in the propagating direction of the surface acoustic waves, each of said plurality of interdigital electrodes comprising a first part connected to a bonding pad provided on the upper major surface of the substrate for external electric connection and having a plurality of finger electrodes extending parallel with each other in a direction that is included in the upper major surface of the substrate and crossing the passage of the surface acoustic waves, and a second part separated from the first part and having a plurality of finger electrodes extending parallel with each other in a direction opposite to the direction of the finger electrodes of the first part, said first part and said second part being so disposed, in each interdigital electrode, that said finger electrodes of the first part and said finger electrodes of the second part are repeated alternately in the propagating direction of the surface acoustic waves with an overlapping of the opposing finger electrodes when viewed in the propagating direction of the surface acoustic waves, said opposing finger electrodes defining the passage of the surface acoustic waves, a second conductor strip provided on the upper major surface of the substrate in correspondence to a region offset from the passage of the surface acoustic waves for connecting the second parts of adjacent interdigital electrodes with each other, a third conductor strip provided on the upper major surface of the substrate in correspondence to a region offset from the passage of the surface acoustic waves for connecting the bonding pad to the first conductor--;

UNITED STATES PATENT AND TRADEMARK OFFICE
CERTIFICATE OF CORRECTION

PATENT NO. : 5,325,573
DATED : July 5, 1994
INVENTOR(S) : MIYASHITA et al.

It is certified that error appears in the above-indentified patent and that said Letters Patent is hereby corrected as shown below:

Col. 8, line 46, delete "and" (first occurrence);
line 48, after "line" insert --such--.

Signed and Sealed this

Twenty-seventh Day of December, 1994

Attest:

BRUCE LEHMAN

Attesting Officer    Commissioner of Patents and Trademarks

UNITED STATES PATENT AND TRADEMARK OFFICE
CERTIFICATE OF CORRECTION

PATENT NO.   : 5,325,573
DATED        : July 5, 1994
INVENTOR(S)  : Miyashita et al.

It is certified that error appears in the above-indentified patent and that said Letters Patent is hereby corrected as shown below:

Title page: [75] Inventors: change "Inagi" to —Tokyo—

In the Certificate of Correction dated December 27, 1994, 2nd Inventor, change "Kanagawa" to —Atsugi—.

Signed and Sealed this

Eighth Day of August, 1995

Attest:

BRUCE LEHMAN

Attesting Officer

Commissioner of Patents and Trademarks